United States Patent
Messenger et al.

(10) Patent No.: US 7,115,955 B2
(45) Date of Patent: Oct. 3, 2006

(54) SEMICONDUCTOR DEVICE HAVING A STRAINED RAISED SOURCE/DRAIN

(75) Inventors: Brian Messenger, Newburgh, NY (US); Renee T. Mo, White Plains, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,738

(22) Filed: Jul. 30, 2004

(65) Prior Publication Data

US 2006/0022266 A1    Feb. 2, 2006

(51) Int. Cl.
H01L 29/76    (2006.01)
H01L 29/94    (2006.01)
H01L 31/062   (2006.01)
H01L 31/113   (2006.01)
H01L 31/119   (2006.01)

(52) U.S. Cl. ...................... 257/369; 257/382
(58) Field of Classification Search .............. 257/368, 257/369, 382
See application file for complete search history.

(56) References Cited

U.S. PATENT DOCUMENTS

| | | | |
|---|---|---|---|
| 5,155,571 A | 10/1992 | Wang et al. ............... 257/19 |
| 5,218,213 A | 6/1993 | Gaul et al. ................. 257/55 |
| 6,342,422 B1* | 1/2002 | Wu ........................... 438/300 |
| 6,358,806 B1 | 3/2002 | Puchner .................... 438/308 |
| 6,406,973 B1* | 6/2002 | Lee ........................... 438/416 |
| 6,420,218 B1 | 7/2002 | Yu ............................. 438/142 |
| 6,499,888 B1* | 12/2002 | Wu ............................. 385/88 |
| 6,504,214 B1 | 1/2003 | Yu et al. .................... 257/347 |
| 6,621,131 B1 | 9/2003 | Murthy et al. ............ 257/408 |
| 6,693,934 B1* | 2/2004 | Wang ...................... 372/43.01 |
| 6,878,628 B1* | 4/2005 | Sophie et al. ............. 438/687 |
| 6,911,386 B1* | 6/2005 | Lee et al. .................. 438/612 |
| 6,939,751 B1* | 9/2005 | Zhu et al. .................. 438/151 |
| 6,946,358 B1* | 9/2005 | Doris et al. ............... 438/424 |
| 2001/0040292 A1 | 11/2001 | Hahn et al. ................ 257/347 |
| 2001/0048119 A1 | 12/2001 | Mizuno et al. ........... 257/192 |
| 2003/0155615 A1* | 8/2003 | Yoshida et al. ........... 257/350 |
| 2003/0218212 A1 | 11/2003 | Lee et al. .................. 257/790 |
| 2004/0241916 A1* | 12/2004 | Chau et al. ................ 438/149 |
| 2005/0164433 A1* | 7/2005 | Doris et al. ............... 438/149 |
| 2005/0170604 A1* | 8/2005 | Orlowski et al. ......... 438/404 |

* cited by examiner

*Primary Examiner*—Hoai Pham
*Assistant Examiner*—Mursalin B. Hafiz
(74) *Attorney, Agent, or Firm*—Scully, Scott, Murphy & Presser, PC.; Todd M. C. Li, Esq.

(57) ABSTRACT

A manufacturable way to recess silicon that employs an end point detection method for the recess etch and allows tight tolerances on the recess is described for fabricating a strained raised source/drain layer. The method includes forming a monolayer comprising oxygen and carbon on a surface of a doped semiconductor substrate; forming an epi Si layer atop the doped semiconductor substrate; forming at least one gate region on the epi Si layer; selectively etching exposed portions of the epi layer, not protected by the gate region, stopping on and exposing the doped semiconductor substrate using end point detection; and forming a strained SiGe layer on the exposed doped semiconductor substrate. The strained SiGe layer serves as a raised layer in which source/drain diffusion regions can be subsequently formed.

6 Claims, 3 Drawing Sheets

SEMICONDUCTOR DEVICE HAVING A STRAINED RAISED SOURCE/DRAIN

BACKGROUND OF INVENTION

The present invention relates to semiconductor devices, and more particularly to complementary metal oxide semiconductor (CMOS) devices having a strained raised source/drain (RSD) layer adjacent to a gate region. The present invention also provides a method for fabricating the strained RSD structure.

As semiconductor development continues to optimize the performance of advanced CMOS, it has become clear that new features are required beyond conventional scaling. For high-performance CMOS, and particularly CMOS on thin silicon-on-insulator (SOI) layers, a raised source/drain structure has been proposed to improve parasitic resistance. More recently, strained silicon has also been proposed for enhanced performance either as part of the crystal lattice in the channel, or alternatively, deformation of the silicon lattice in the channel by external stress techniques. A third method used in the prior art is to provide a very steep retrograde well structure that improves mobility and short channel performance.

One such technique is to provide a strained layer on the source and drain regions using SiGe. In order to enable significant strain on the channel, it is preferable to recess the silicon in the source/drain region and then grow a strained SiGe selective epi film in these recessed areas. One problem with this approach is that the recess of the source/drain silicon must be controlled and reproducible to obtain a manufacturable process. Traditionally, this recess was done using a wet etch or a dry plasma etch in a timed fashion. These methods suffer from the fact that the etch rate may vary from day to day and also the surface of the silicon being etched is variable and may have a variable induction time before etching begins. This leads to a poorly controlled recess that is not suitable for largescale manufacturing.

In view of the above, a method is needed in which a recessed strained raised source/drain structure can be obtained wherein the recess of the source and drain silicon is controllable and reproducible thereby providing a manufacturable process.

SUMMARY OF INVENTION

The present invention provides a technique that solves the aforementioned problem by presenting a manufacturable way to recess silicon that employs an end point detection method for the recess etch and allows tight tolerances on the recess. The present invention also provides a semiconductor structure that is fabricated by the aforementioned method.

In broad terms, the semiconductor structure of the present invention includes: a doped semiconductor substrate; a monolayer comprising carbon and oxygen located on a surface of the doped semiconductor substrate; an epi Si layer located on a portion of the doped semiconductor substrate; a gate region located on the epi Si layer; and a strained SiGe layer located on other portions of the doped semiconductor substrate adjacent to the epi Si layer and the gate region. In accordance with the present invention, the strained SiGe layer serves as a raised layer for source/drain diffusion regions.

The structure described above is formed in the present invention by utilizing processing steps that include forming a monolayer comprising oxygen and carbon on a surface of a doped semiconductor substrate; forming an epi Si layer atop the doped semiconductor substrate; forming at least one gate region on the epi Si layer; selectively etching exposed portions of the epi Si layer, not protected by the gate region, stopping on and exposing the doped semiconductor substrate using end point detection; and forming a raised strained SiGe layer on the exposed doped semiconductor substrate.

DETAILED DESCRIPTION

Figure 1A:
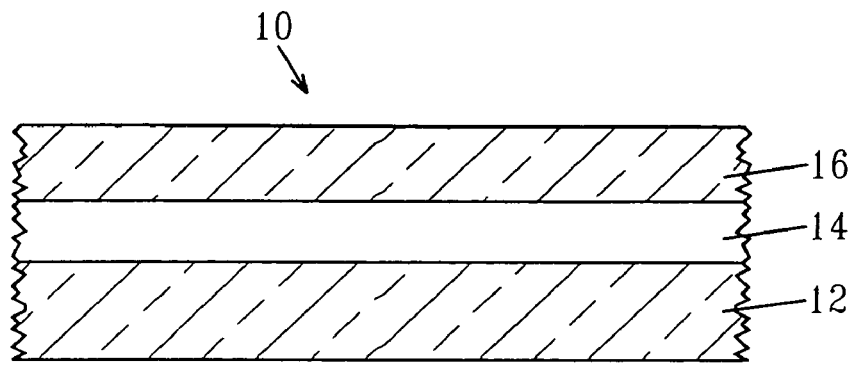
FIGS. 1A–1F are pictorial representations (through cross sectional views) illustrating the basic processing steps that are employed in the present invention.

The present invention, which provides a manufacturable recessed raised strained source/drain structure and a process for fabricating the same, will now be described in greater detail by referring to the drawings that accompany the present application.

Although the description and drawings illustrate the use of an SOI substrate as the initial substrate, other semiconductor substrates besides SOI can be used. Illustrative examples of other initial substrates that can be used in the present invention include, but are not limited to: Si, SiC, SiGe, SiGeC, Ge, InAs, InP as well as other III/V or II/VI compound semiconductors. The initial substrate may also comprise a SiGe-on-insulator substrate or any other layered semiconductor, such as, for example, Si/SiGe.

Although other semiconductor substrates can be employed, it is preferred to use an SOI substrate, such as shown in FIG. 1A, as the initial substrate 10. SOI substrates are preferred since they provide a substrate for building a high-performance CMOS device thereon. The SOI substrate includes a Si-containing substrate layer 12, a buried insulating layer 14 located atop the Si-containing substrate layer 12, and a Si-containing layer 16 located atop the buried insulating layer 14. The Si-containing layer 16 may also be referred to herein as the SOI layer of the substrate. The buried insulating layer 14 can be comprised of any insulating material including, for example, oxides and nitrides. Typically, the buried insulating layer 14 is a buried oxide (BOX) region. The term "Si-containing" is used herein to denote any semiconductor material that includes silicon. The Si-containing layer 16 of the SOI substrate may have a variable thickness, which is dependent on the technique that is used in forming the SOI substrate. Typically, however, the Si-containing layer 16 of the SOI substrate has a thickness from about 10 to about 1000 nm, with a thickness from about 100 to about 500 nm being more typical. The thickness of the buried insulating layer 14 may also vary depending upon the technique used in fabricating the SOI substrate. Typically, however, the buried insulating layer 14 has a thickness from about 100 to about 1000 nm, with a thickness from about 120 to about 200 nm being more typical. The thickness of the Si-containing substrate layer 12 of the SOI substrate is inconsequential to the present invention.

The SOI substrate shown in FIG. 1A can be formed using a layer transfer process such as, a bonding process. Alternatively, a technique referred to as separation by implanted oxygen (SIMOX) wherein ions, typically oxygen, are implanted into a bulk Si-containing substrate and then the substrate containing the implanted ions is annealed under conditions that are capable of forming a buried insulating layer 14 can be employed.

Next, at least one trench (not shown in the drawings) that extends to the upper surface of the Si-containing substrate layer 12 is formed by lithography and etching. The lithography step includes applying a photoresist to the surface of the SOI substrate, exposing the photoresist to a pattern of radiation, and developing the exposed photoresist using a conventional resist developer. The etching step used in forming the trench includes any standard Si directional reactive ion etch process. Other dry etching processes such as plasma etching, ion beam etching and laser ablation, are also contemplated herein. The etch can be stopped on the top of the buried insulating layer 14 (also not shown), or on the Si-containing substrate 12 underneath the buried insulating layer 14. After etching, the patterned photoresist is typically removed utilizing a conventional resist stripping process. In some embodiments, the patterned photoresist may remain on the structure and be removed after the subsequent etching step.

Figure 1B:
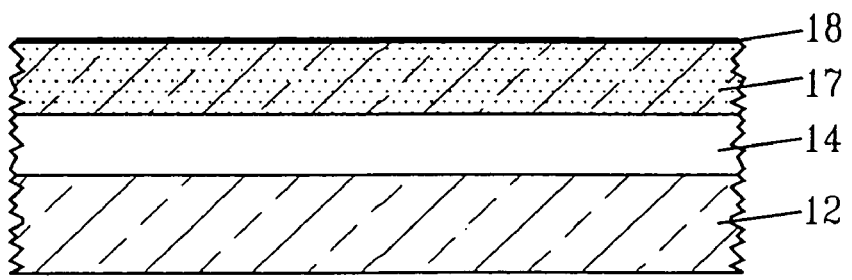

At this point of the present invention, the Si-containing layer 16 of the SOI substrate is doped utilizing ion implantation. The dopants that are implanted into the Si-containing layer 16 can be n-type dopants such as P, As, or Sb ions, or p-type dopants such as B ions. The dopant concentration within the Si-containing layer 16 is typically from about 1E17 to about 1E19 atoms/cm$^3$. Following implantation of the dopant ions within the Si-containing layer 16 of the SOI substrate, the dopants may be annealed using any conventional annealing process that is capable of activating the implanted dopants. The structure that is formed after the implant and anneal step is shown, for example, in FIG. 1B. In FIG. 1B, reference numeral 17 denotes the doped Si-containing layer of the SOI substrate. The ion implantation and annealing performed at this point of the present invention forms the structure's well implant regions.

Next, a monolayer comprising carbon and oxygen is formed at the surface of the doped Si-containing layer 17. The monolayer, which is referred to by reference numeral 18, can be formed by atomic layer deposition (ALD) or a chemical treatment process. Any conventional ALD process can be utilized. The chemical treatment is preferred over the ALD process.

When the monolayer 18 is formed by a chemical treatment process, the doped semiconductor layer 17 is first subjected to a step in which the surface of the doped Si-containing layer 17 is hydrogen terminated. By "hydrogen terminated" it is meant that the outer surface of the doped Si-containing layer 17 includes hydrogen atoms, e.g., a structure having —Si—H bonds is formed. This step, which results in hydrogen termination, is performed utilizing dilute hydrofluoric acid or any other like solution that can provide hydrogen termination.

After terminating the doped Si-containing layer 17 of the SOI substrate with hydrogen atoms, the doped Si-containing layer 17 is subjected to an iodine/alcohol treatment step. This chemical treatment step results in the formation of a monolayer 18 comprising carbon and oxygen on the surface of the doped Si-containing layer 17. Specifically, a solution comprising iodine and an alcohol is applied to the doped Si-containing layer 17. The solution is prepared by adding the two components together and then thoroughly mixing the same.

The application of the iodine/alcohol solution may occur by immersion, brush coating, dip coating, spray coating, or any other like coating process. In some embodiments, the solution can be evaporated and applied as a gaseous mixture as well. The application of the iodine/alcohol solution to the doped SOI layer 17 typically occurs at room temperature (i.e., 20° C.). Although room temperature is typically employed, the solution containing iodine and alcohol may be applied at temperatures that are slightly elevated from room temperature. The contact time for the solution containing iodine and alcohol may vary depending on the amount of iodine and alcohol in the solution. Typically, the contact of the solution containing iodine and alcohol to the doped SOI layer 17 is from about 15 to about 60 minutes, with a contact time from about 20 to about 30 minutes being more typical.

As indicated above, the solution employed in the present invention for forming the monolayer of carbon and oxygen comprises iodine and alcohol. The amount of iodine present in the solution is from about $1 \times 10^{-4}$ to about $1 \times 10^{-3}$ M in alcohol, with an amount from about $5 \times 10^{-4}$ M in alcohol being more typical.

The alcohol employed in the solution may comprise any straight chain or branched monohydric alcohol, preferably methanol is employed.

After contact with the iodine/alcohol solution, the treated structure is typically rinsed in an alcohol and then dried using a standard drying process well known in the art. The alcohol used to rinse the structure is typically, but not necessarily, the same alcohol as present in the iodine/alcohol solution. A typical drying process that can be used in the present invention includes a surface tension drying process wherein a mist including isopropanol and water is employed.

Figure 2:
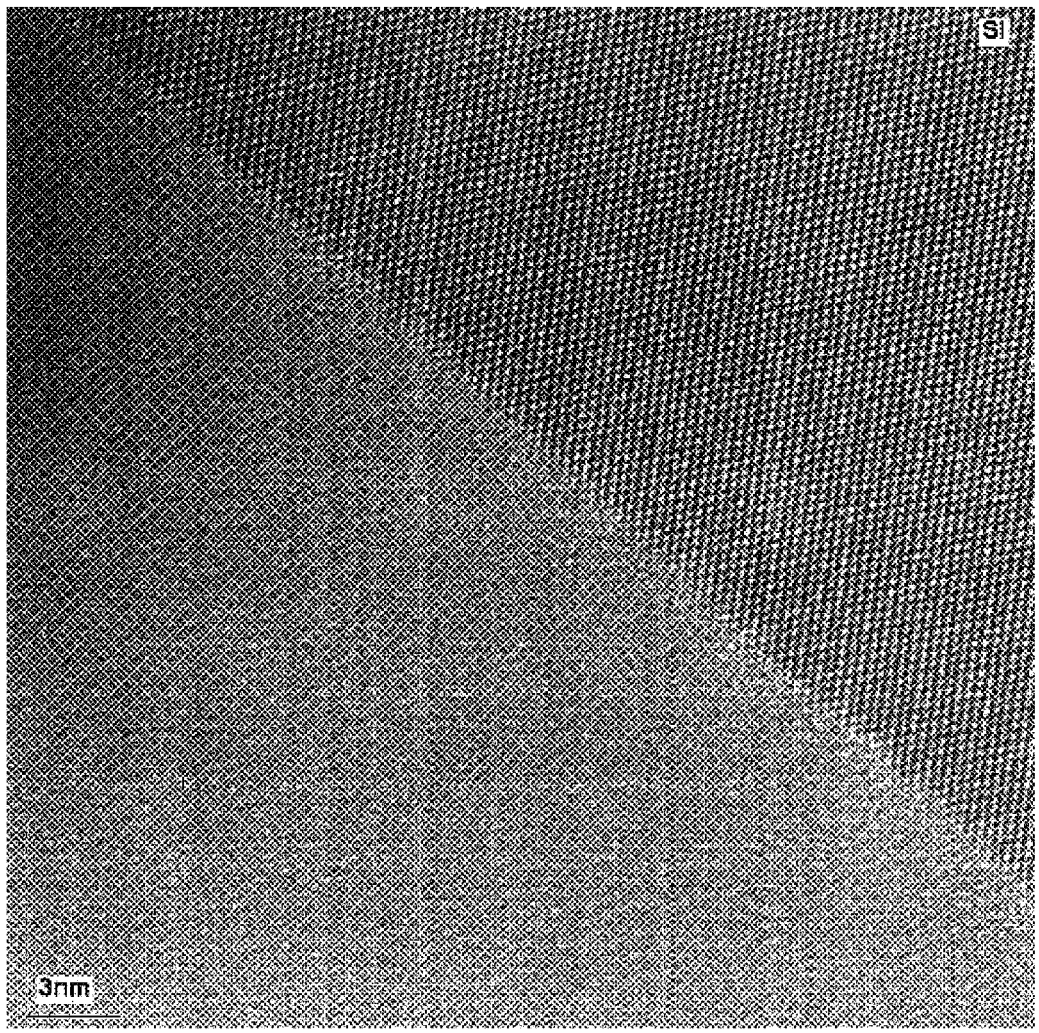
FIG. 2 shows an TEM of a alkoxy-terminated silicon with a tetraethylorthosilicate (TEOS) overlayer.

The monolayer 18 serves as a diffusion barrier to the dopants previously formed into the Si-containing layer of the SOI substrate. The monolayer provides alkyl or alkoxy termination to the doped Si-containing layer 17 without disrupting the crystal structure of the subsequently grown epi-Si overlayer. This is shown in the TEM provided in FIG. 2.

After forming the monolayer 18 on the surface of the doped Si-containing layer 17 of the SOI substrate, a Si layer 20 is formed by a conventional epitaxial growth process. The epi Si layer 20 is formed at a temperature of less than 800° C. The epi Si layer 20 has a thickness that is typically from about 10 to about 30 nm. Note that the epi Si layer 20 is formed only on Si surfaces that contain the monolayer 18.

Figure 1C:
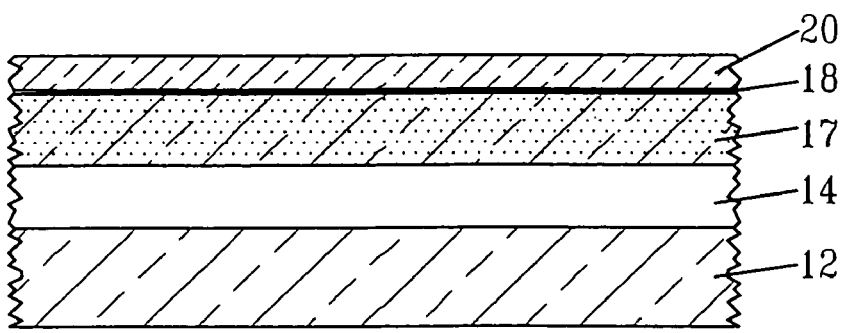

The resultant structure after monolayer 18 and epi Si layer 20 formation is shown, for example, in FIG. 1C. Because of the presence of monolayer 18, the dopants previously implanted into the Si-containing layer 16 of the SOI substrate will pile up at the SOI/epi interface during the thermal cycle of the epi Si layer 20 deposition and any subsequent anneals. Moreover, the monolayer 18 substantially prevents the dopants from diffusing from the doped Si-containing layer 17 to the epi Si layer 20.

In some embodiments, and if not previously formed, the trench isolation regions (not shown) can be formed at this point of the present invention using the technique described above.

Figure 1D:
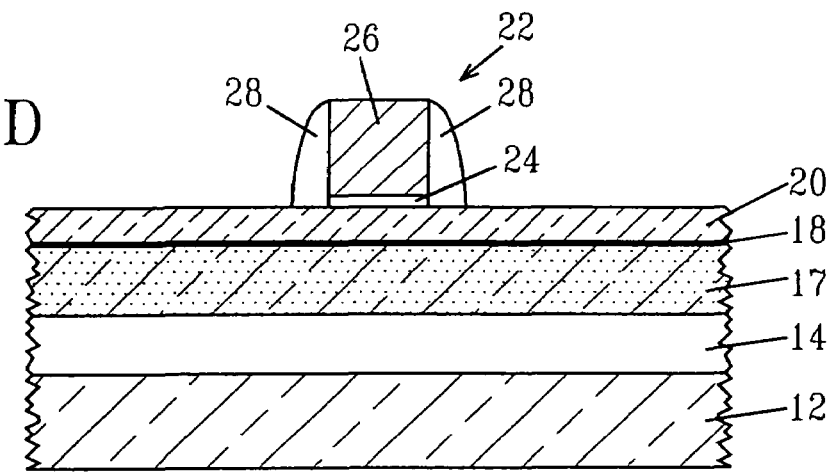

After forming the epi Si layer 20, conventional CMOS processing can be carried out so as to form the transistor structure shown in FIG. 1D. The transistor structure shown in FIG. 1D comprises a gate region 22 that includes a gate dielectric 24, a gate electrode 26 and spacers 28 formed on at least the sidewalls of the gate electrode 26. Although a single transistor structure is described and illustrated, the present invention contemplates the formation of a plurality of such transistor structures atop the epi Si layer 20.

The gate region 22 can be formed by first forming gate dielectric 24 on the entire surface of the epi Si layer 20. The gate dielectric 24 can be formed by a thermal growing process such as, for example, oxidation, nitridation or oxynitridation. Alternatively, the gate dielectric 24 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 24 may also be formed utilizing any combination of the above processes.

The gate dielectric 24 is comprised of an insulating material including, but not limited to: an oxide, nitride, oxynitride and/or silicate. In one embodiment, it is preferred that the gate dielectric 24 is comprised of an oxide such as, for example, $SiO_2$, $HfO_2$, $ZrO_2$, $Al_2O_3$, $TiO_2$, $La_2O_3$, $Sr-TiO_3$, $LaAlO_3$, and mixtures thereof, including the addition of silicon and nitrogen.

The physical thickness of the gate dielectric 24 may vary, but typically, the gate dielectric 24 has a thickness from about 0.5 to about 10 nm, with a thickness from about 0.5 to about 3 nm being more typical.

After forming the gate dielectric 24, a blanket layer of a gate electrode material 26 is formed on the gate dielectric 24 utilizing a known deposition process such as physical vapor deposition (PVD), CVD or evaporation. The gate electrode material 26 may comprise polysilicon, SiGe, a silicide, or a metal. Preferably, the gate electrode 26 is comprised of a suicide or a metal. Examples of metals that can be used as the gate electrode 26 include, but are not limited to: W, Pt, NiSi, $CoSi_2$. The blanket layer of gate electrode material 26 may be doped or undoped. If doped, an in-situ doping deposition process may be employed. Alternatively, a doped gate electrode 26 can be formed by deposition, ion implantation and annealing.

The doping of the gate electrode 26 will shift the workfunction of the gate formed. Illustrative examples of doping ions include As, P, B, Sb, Bi, In, Al, Tl, Ga or mixtures thereof. The thickness, i.e., height, of the gate electrode material 26 deposited at this point of the present invention may vary depending on the deposition process employed. Typically, the gate electrode material 26 has a vertical thickness from about 20 to about 180 nm, with a thickness from about 40 to about 150 nm being more typical.

In some embodiments, an optional hardmask (not shown) may be formed atop the gate electrode material 26 by utilizing a conventional deposition process. The optional hardmask can be comprised of a dielectric such as an oxide or nitride.

The blanket gate electrode material 26 (and optionally the gate dielectric 24) is then patterned by lithography and etching so as to provide at least one gate region 22, without the spacers. Each gate region 22 formed may have the same dimension, i.e., length, or they can have variable dimensions to improve device performance. The lithography step includes applying a photoresist to the upper surface of the blanket deposited gate electrode material 26, exposing the photoresist to a desired pattern of radiation and developing the exposed photoresist utilizing a conventional resist developer. The pattern in the photoresist is then transferred to the blanket layer of gate electrode material 26 utilizing a dry etching process. The patterned photoresist is removed after etching has been completed. In some embodiments, a hardmask may be formed prior to formation of the photoresist and used in patterning the blanket layer of gate electrode material 26.

Suitable dry etching processes that can be used in the present invention in forming the gate region 22 include, but are not limited to: reactive ion etching, ion beam etching, plasma etching or laser ablation. The dry etching process employed is typically selective to the underlying gate dielectric 24 therefore this etching step does not typically remove the gate dielectric 24. In some embodiments, this etching step may however be used to remove portions of the gate dielectric 24 that are not protected by the gate region 22. The latter embodiment is depicted in the drawings of the present application.

Next, at least one spacer 28 is formed on exposed sidewalls of each gate electrode. The at least one spacer 28 is comprised of an insulator such as an oxide, nitride, oxynitride and/or any combination thereof. The at least one spacer 28 is formed by deposition and etching.

In addition to the at least one spacer 28, the present invention also contemplates a structure including multiple spacers. In particular, the present invention contemplates a structure including a first spacer having a first width and a second spacer having a second width wherein the first width is narrower than the second width. Typically, each spacer 28 has a width, as measured at the bottom, from about 20 to about 80 nm.

In addition to the above method, the gate region 22 can be formed utilizing a damascene process in which a dummy gate region is first formed on the epi-Si layer 20. A planarizing dielectric such as an oxide is then deposited and the resultant structure is planarized to expose an upper surface of the dummy gate region. The dummy gate region is then selectively removed by etching and then gate region 22 is formed.

Figure 1E:
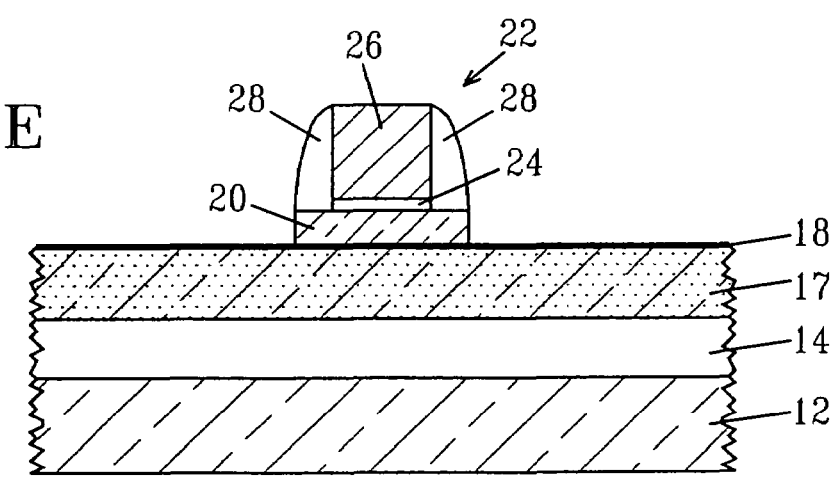

Next, and as shown in FIG. 1E, the exposed portion of the epi Si layer 20, not protected by the gate region 22, is then removed using the doped Si-containing layer 17 or the monolayer 18 as an end point etching detection layer. The end point detection can include the use of an analyzer that uses effluents from the gas to detect the presence of carbon and/or oxygen within the monolayer 18 or the sudden gradient of dopant ions within the doped Si-containing layer 17. The selective etching of the exposed portion of epi Si layer is performed utilizing any etch process that selectively removes epi Si as compared to a doped semiconductor layer. For example, $CF_4$, $CHF_3$ or $NF_3$ can be used to selectively remove the exposed portion of epi Si layer 20.

Figure 1F:
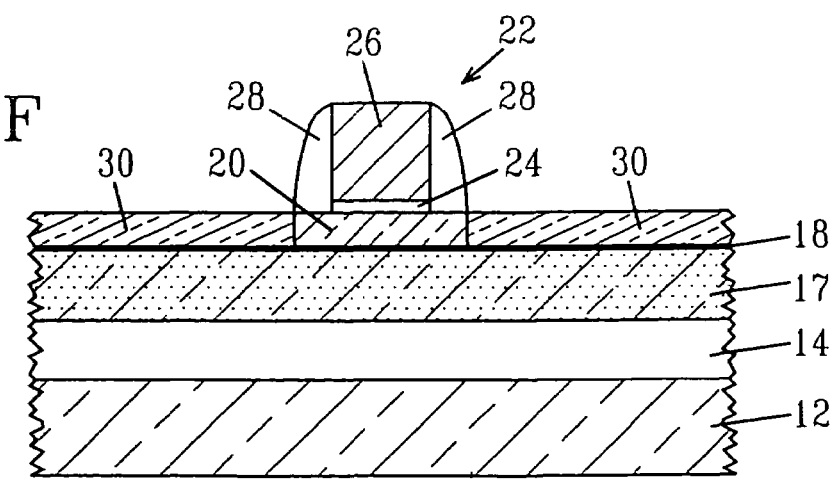

After removing the exposed portion of the epi Si layer 20, which exposes the underlying doped Si-containing layer 17, a strained SiGe layer 30 is formed. The resultant structure including the strained SiGe layer 30 is shown, for example, in FIG. 1F. The strained SiGe layer is formed utilizing any process that is capable of forming a strained SiGe layer. For example, the strained SiGe layer 30 can be formed by ultra-high vacuum CVD epitaxy (UHCVD epi) or RTCVD epi, (reduced temperature CVD epi).

The thickness of the strained SiGe layer 30 may vary depending on the technique used in forming the same. Typically, the strained SiGe layer 30 has a thickness from about 20 nm to about 200 nm, with a thickness from about 40 nm to about 80 nm being more typical. The strained SiGe layer 30 formed at this point of the present invention is the raised layer of the structure wherein source/drain diffusion regions can be subsequently formed.

Source/drain regions (not shown) can now be implanted into the strained SiGe layer 30 and then activated by thermal annealing. Alternatively, the epitaxial films can be grown with dopants contained within (in-situ doped epi). After formation of the source/drain regions within layer 30, silicide contacts (not shown) can be formed atop the source/drain regions and thereafter conventional backend-of-the line (BEOL) processing may be performed.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

We claim:

1. A semiconductor structure comprising:
   a doped semiconductor substrate;
   a monolayer comprising carbon and oxygen located on a surface of the doped semiconductor substrate;
   an epi Si layer located on a portion of said doped semiconductor substrate;
   a gate region located on said epi Si layer; and
   a strained SiGe layer located on said doped semiconductor substrate adjacent to said epi Si layer and said gate region, said strained SiGe layer serving as a raised layer for source/drain diffusion regions.

2. The semiconductor structure of claim 1 wherein the doped semiconductor substrate comprises a silicon-on-insulator (SOI) layer of an SOI substrate.

3. The semiconductor structure of claim 2 wherein said SOI layer has a thickness from about 10 nm to about 120 nm.

4. The semiconductor structure of claim 1 wherein said doped semiconductor substrate comprises an n-type dopant.

5. The semiconductor structure of claim 1 wherein said doped semiconductor substrate comprises a p-type dopant.

6. The semiconductor structure of claim 1 wherein said gate region comprises a gate dielectric, a gate electrode overlaying the gate dielectric, and at least one spacer located on a sidewall of said gate electrode.

* * * * *